(12) United States Patent
De Geronimo

(10) Patent No.: US 8,260,565 B2
(45) Date of Patent: Sep. 4, 2012

(54) HIGH DYNAMIC RANGE CHARGE MEASUREMENTS

(75) Inventor: Gianluigi De Geronimo, Syosset, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 854 days.

(21) Appl. No.: 12/196,504

(22) Filed: Aug. 22, 2008

(65) Prior Publication Data

US 2010/0049459 A1    Feb. 25, 2010

(51) Int. Cl.
*G01R 19/165* (2006.01)
(52) U.S. Cl. ............. 702/64; 702/65; 702/107; 702/116
(58) Field of Classification Search .................... 702/40, 702/64, 65, 107, 116
See application file for complete search history.

(56) References Cited

U.S. PATENT DOCUMENTS

| | | | | |
|---|---|---|---|---|
| 4,429,285 | A * | 1/1984 | Bradshaw | 330/279 |
| 5,750,270 | A * | 5/1998 | Tang et al. | 428/611 |
| 2003/0063362 | A1* | 4/2003 | Demir et al. | 359/240 |
| 2004/0169128 | A1* | 9/2004 | Mizuno | 250/214 R |
| 2005/0082500 | A1* | 4/2005 | Yamaguchi | 250/580 |
| 2008/0165134 | A1* | 7/2008 | Krah | 345/173 |

OTHER PUBLICATIONS

V. Bonvicini, G. Orzan, G. Zampa, N. Zampa, "CASIS10: A Prototype VLSI Front-End ASIC with Ultra-Large Dynamic Range and Integrated ADC for Silicon Calorimetry in Space Experiments," Nucl. Instrum. Methods, A 572, pp. 340-344, 2007.

E. Kraft, P. Fisher, M. Karagounis, M. Koch, H. Krueger, I. Peric, N. Wermes, C. Herrmann, A. Nascetti, M. Overdick, and W. Ruetten, "Counting and Integrating Readout for Direct conversion X-ray Imaging: Concept, Realization and First Prototype Measurements," IEEE Trans. Nucl. Sci., vol. 54, No. 2, pp. 383-390, 2007.

G. Mazza, R. Cirio, M. Donetti, A. La Rose, A. Luparia, F. Marchetto, and C. Peroni, "A 64-Channel Wide Dynamic Range Charge Measurement ASIC for Strip and Pixel Ionization Detectors," IEEE Trans. Nucl. Sci, vol. 52, vol. 4, pp. 847-853, 2005.

G. De Geronimo and P. O'Connor, "MOSFET Optimization in Deep Submicron Technology for Charge Amplifiers," *IEEE Trans. Nucl. Sci.*, vol. 52, No. 6, pp. 3223-3232, Dec. 2005.

G. De Geronimo and P. O'Connor, "A CMOS Fully Compensated Continuous Reset System," *IEEE Trans. Nucl. Sci.*, vol. 47, No. 4, pp. 1458-1462, Aug. 2000.

(Continued)

*Primary Examiner* — Michael Nghiem
*Assistant Examiner* — Paul D Lee
(74) *Attorney, Agent, or Firm* — Dorene M. Price

(57) ABSTRACT

A charge amplifier for use in radiation sensing includes an amplifier, at least one switch, and at least one capacitor. The switch selectively couples the input of the switch to one of at least two voltages. The capacitor is electrically coupled in series between the input of the amplifier and the input of the switch. The capacitor is electrically coupled to the input of the amplifier without a switch coupled therebetween. A method of measuring charge in radiation sensing includes selectively diverting charge from an input of an amplifier to an input of at least one capacitor by selectively coupling an output of the at least one capacitor to one of at least two voltages. The input of the at least one capacitor is operatively coupled to the input of the amplifier without a switch coupled therebetween. The method also includes calculating a total charge based on a sum of the amplified charge and the diverted charge.

21 Claims, 5 Drawing Sheets

OTHER PUBLICATIONS

G. De Geronimo, P. O'Connor, and J. Grosholz, "A CMOS Baseline Holder (BLH) for Readout ASICs," *IEEE Trans. Nucl. Sci.*, vol. 47, No. 3, pp. 818-822, Jun. 2000.

G. De Geronimo, P. O'Connor, A. Kandasamy, "Analog CMOS Peak Detect and Hold Circuits". Part 1. Analysis of the Classical Configuration, *Nucl. Instrum. Methods*, A484, pp. 533-543, 2002.

G. De Geronimo, P. O'Connor, A. Kandasamy, "Analog CMOS Peak Detect and Hold Circuits—Part 2. The Two-Phase Offset-Free and Derandomizing Configuration," *Nucl. Instrum. Methods*, A484, pp. 544-556, 2002.

P. O'Connor, G. De Geronimo, J. Grosholz, A. Kandasamy, S. Junnarkar, J. Fried, "Multichannel Energy and Timing Measurements with the Peak Detector/Derandomizer ASIC," Proc. 2004 Nuclear Science Symp., Rome, Italy, 2004.

F. Mathy, A. Gliere, E. G. d'Aillon, P. Masse', M. Picone, J. Tabary, and L. Verger, "A Three-Dimensional Model of CdZnTe Gamma-Ray Detector and its Experimental Validation," *IEEE Trans. Nucl. Sci*, vol. 51, No. 5, pp. 2419-2426, Oct. 2004.

A. Dragone, G. De Geronimo, J. Fried, A. Kandasamy, P. O'Connor and E. Vernon, "The PDD ASIC: Highly Efficient Energy and Timing Extraction for High-Rate Applications", 2005 *IEEE Trans. Nucl. Sci* Symposium Conference Record, pp. 914-918 (2005).

\* cited by examiner

HIGH DYNAMIC RANGE CHARGE MEASUREMENTS

This invention was made with Government support under contract number DE-AC02-98CH10886, awarded by the U.S. Department of Energy. The Government has certain rights in the invention.

BACKGROUND OF THE INVENTION

1. Field of the Invention

The present invention relates to charge amplifiers for use in radiation sensors, and more particularly to such charge amplifiers that exhibit an increased dynamic range.

2. Description of the Prior Art

In radiation sensors, ionizing radiation generates free charges in an amount Q that is proportional to the energy of the ionizing radiation. Charge is typically quantified by using a low-noise charge amplifier, which performs an integration through a feedback capacitor C, thus converting the charge Q into a voltage V=Q/C.

In FIG. 1, a charge amplifier configuration 10 is shown, where $\overline{v_n^2}$ represents a noise power from signal processing electronics following the charge amplifier; such as a filter, buffer, analog-to-digital converter, and the like.

In order to make the noise contribution from the processing electronics negligible compared to the signal voltage, which is determined by V=Q/C, a charge-to-voltage conversion gain 1/C is preferably maximized. This can be achieved by minimizing the value of C. Assuming a noiseless charge amplifier, the signal-to-noise ratio is given by $$Q/\left(C\sqrt{\overline{v_n^2}}\right),$$

and the minimum detectable charge is given by $$Q_{min} \approx C\sqrt{\overline{v_n^2}}.$$

On the other hand, a saturation voltage of the amplifier, which is equal to the supply voltage $V_{DD}$ in an ideal case, limits the measurable charge Q to a maximum value $Q_{MAX}=V_{DD}C$. An assumption is made that the virtual ground input of the amplifier is at 0V.

The result is that a dynamic range $Q_{MAX}/Q_{MIN}$ of the configuration shown in FIG. 1 is independent of C and given by $$V_{DD}/\sqrt{\overline{v_n^2}}.$$

Even if the dynamic range can be improved by filtering performed in the signal processing stage, the result is limited by technology and system constraints to typically no more than a few hundred, such as 100-300.

Therefore, it would be advantageous if the dynamic range in charge amplifier configurations could be increased to well above a few hundred once technology and system constraints, such as signal processing and associated noise, are taken into consideration.

SUMMARY OF THE INVENTION

The present invention relates to a charge amplifier for use in radiation sensing, which includes an amplifier including an input, at least one switch including an input, wherein the switch selectively couples the input of the switch to one of at least two voltages, and at least one capacitor electrically coupled in series between the input of the amplifier and the input of the switch, the capacitor is electrically coupled to the input of the operational amplifier without a switch coupled therebetween.

The amplifier may include an output and an operational amplifier, the input of the amplifier is operatively coupled to an anode of the operational amplifier, and the output of the amplifier is operatively coupled to a cathode of the operational amplifier. The charge amplifier may include a second capacitor electrically coupled in parallel with the amplifier. The charge amplifier may include a comparator including a first input, a second input, and an output, wherein the first input is operatively coupled to the output of the amplifier and the second input is operatively coupled to a threshold voltage, and a logic device operatively coupled to the output of the comparator. The logic device may control the switch in response to the output of the comparator.

The voltages may include a first voltage less than a second voltage, wherein the logic device controls the at least one switch to couple the input of the switch to the second voltage in response to the output of the amplifier being greater than the threshold voltage. The logic device may control the switch to couple the input of the switch to the first voltage in response to the output of the amplifier being less than the threshold voltage. The charge amplifier may be implemented using at least one of an Application Specific Integrated Circuit (ASIC), a microprocessor, a microcontroller, a programmable logic device, and/or a gate array The present invention further relates to a method of measuring charge in radiation sensing, which includes selectively diverting charge from an input of an amplifier to an input of at least one capacitor by selectively coupling an output of the at least one capacitor to one of at least two voltages, wherein the input of the capacitor is operatively coupled to the input of the amplifier without a switch coupled therebetween, and calculating a total charge based on a sum of the amplified charge and the diverted charge.

The method may include comparing voltage at the output of the amplifier to a threshold voltage, and controlling the selective diversion of charge from the input of the amplifier to the input of the capacitor based on the comparison. The method may include controlling the selective diversion of charge from the input of the amplifier to the input of the capacitor by operatively coupling an output of the capacitor to the second voltage in response to the output of the amplifier being greater than the threshold voltage. The method may include controlling the selective diversion of charge from the input of the amplifier to the input of the at least one capacitor by operatively coupling an output of the capacitor to the first voltage in response to the output of the amplifier being less than the threshold voltage. The method may include implementing the charge amplifier using at least one of an Application Specific Integrated Circuit (ASIC), a microprocessor, a microcontroller, a programmable logic device, and/or a gate array.

The present invention still further relates to a computer-readable medium including instructions, wherein execution of the instructions by at least one computing device controls measurement of charge in radiation sensing by selectively diverting charge from an input of an amplifier to an input of at least one capacitor by selectively coupling an output of the capacitor to one of at least two voltages, wherein the input of the capacitor is operatively coupled to the input of the amplifier without a switch coupled therebetween, and calculating a total charge based on a sum of the amplified charge and the diverted charge.

Execution of the instructions by at least one computing device may control measurement of charge in radiation sensing by coupling a second capacitor electrically in parallel with the amplifier. Execution of the instructions by at least one computing device may control measurement of charge in radiation sensing by comparing voltage at the output of the amplifier to a threshold voltage, and controlling the selective diversion of charge from the input of the amplifier to the input of the capacitor based on the comparison. Execution of the instructions may control measurement of charge in radiation sensing by controlling the selective diversion of charge from the input of the amplifier to the input of the at least one capacitor by operatively coupling an output of the at least one capacitor to the second voltage in response to the output of the amplifier being greater than the threshold voltage. Execution of the instructions may control measurement of charge in radiation sensing by controlling the selective diversion of charge from the input of the amplifier to the input of the capacitor by operatively coupling an output of the capacitor to the first voltage in response to the output of the amplifier being less than the threshold voltage.

Other objects and features of the present invention will become apparent from the following detailed description considered in conjunction with the accompanying drawings. It is to be understood, however, that the drawings are designed as an illustration only and not as a definition of the limits of the invention.

DETAILED DESCRIPTION OF THE EMBODIMENTS

Figure 2:
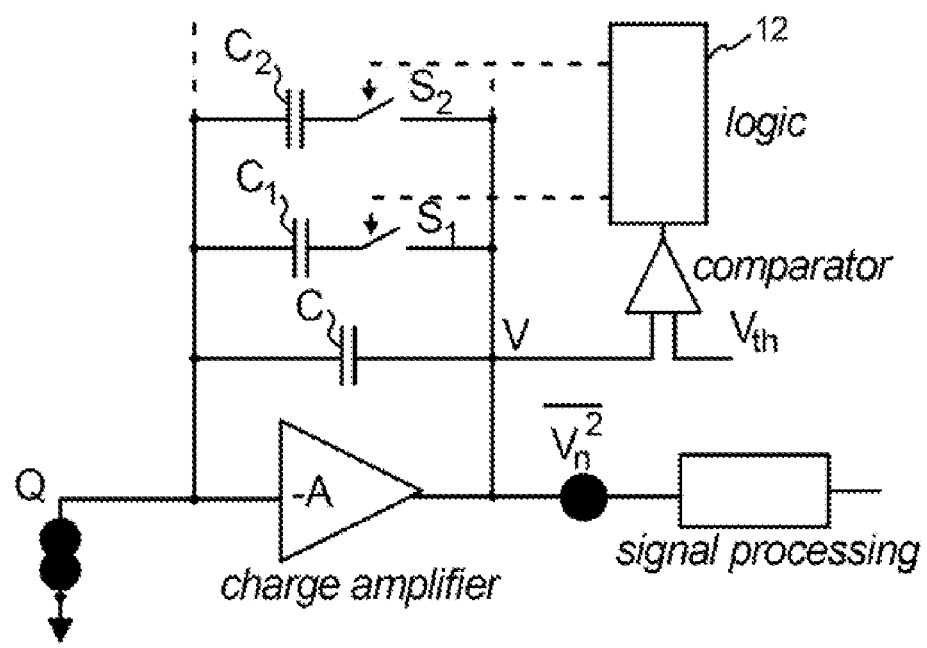
FIG. 2 is a block diagram of a charge amplifier in a multiple-gain configuration.

To increase dynamic range in charge amplifiers, three methods are proposed: a multiple-gain method, a current charge-pump method, and a capacitive charge-pump method.
Multiple-Gain Method This method includes progressively reducing the gain by adding in parallel to C one or more capacitors $C_j$ through switches $S_j$, as shown in FIG. 2 and described in greater detail in V. Bonvicini, G. Orzan, G. Zampa, "CASIS10: A Prototype VLSI Front-End ASIC with Ultra-Large Dynamic Range and Integrated ADC for Silicon Calorimetry in Space Experiments," Nucl. Instrum. Methods, A 572, pp. 340-344, 2007, which is incorporated herein by reference. If the output voltage V exceeds a threshold $V_{th}$, a logic circuit 12 enables a first capacitor $C_1$ to reduce the gain from 1/C to 1/(C+$C_1$). If after enabling $C_1$, V does not fall below the threshold, the logic circuit 12 enables connection of a second capacitor $C_2$, reducing the gain to 1/(C+$C_1$+$C_2$). This sequence continues for an arbitrary number of capacitors until V falls below the threshold. The closed switches preferably define the charge-to-voltage conversion gain to be applied to the resulting voltage V. The values of the capacitors $C_j$ are preferably chosen to cover the dynamic range of interest. When the switch $S_j$ is open, the terminal of the capacitor $C_j$ can be connected either to the input or to ground, the latter is preferred to avoid charge injection from switches connected to the input.

Figure 1:
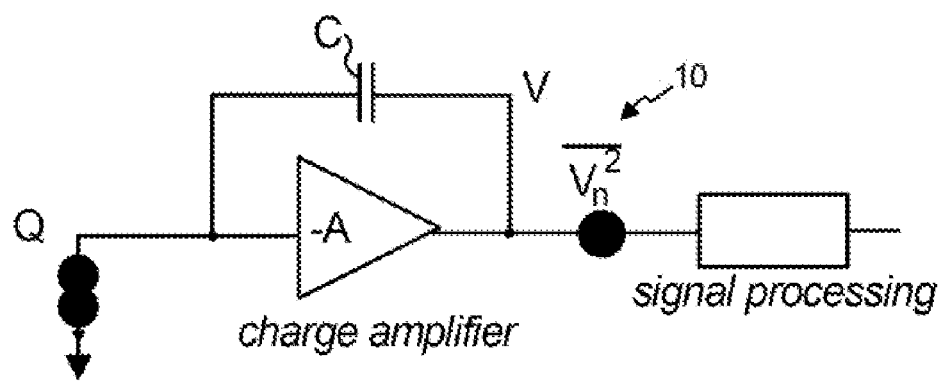
FIG. 1 is a block diagram of a conventional charge amplifier configuration.

The disadvantage of this method is that the reduction in gain limits the signal-to-noise ratio to that achievable with the configuration shown in FIG. 1. Accordingly, with one capacitor, the maximum signal-to-noise ratio is given by $$V_{DD}C \big/ \left(C\sqrt{\overline{v_n^2}}\right) = \frac{V_{DD}}{\sqrt{\overline{v_n^2}}}$$

Likewise, with N capacitors, the maximum dynamic range is identically given by $$V_{DD}NC \big/ \left(NC\sqrt{\overline{v_n^2}}\right) = \frac{V_{DD}}{\sqrt{\overline{v_n^2}}}.$$

Current Charge-Pump Method

Figure 3:
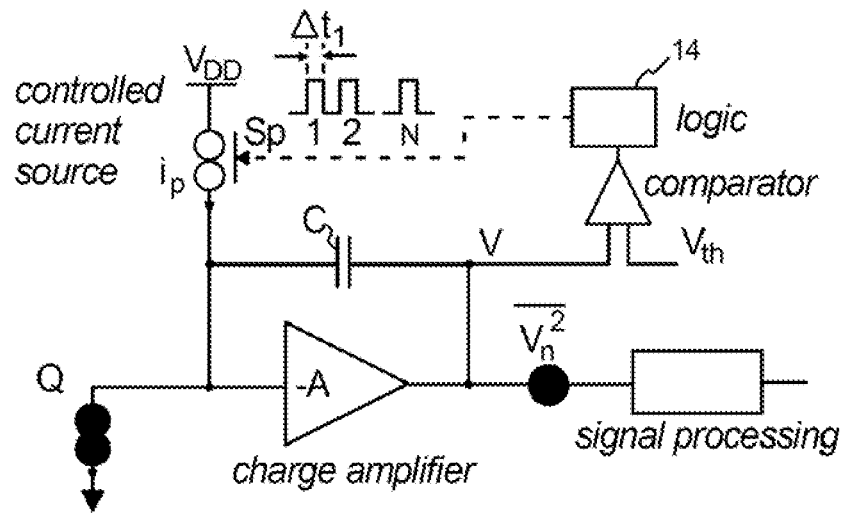
FIG. 3 is a block diagram of a charge amplifier in a charge-pump configuration.

This method includes subtracting charge by enabling a controlled current source of value $i_p$ for fixed time intervals $\Delta t_j$, as shown in FIG. 3 and described in greater detail in E. Kraft, P. Fisher, M. Karagounis, M. Koch, H. Krueger, I. Peric, N. Wermes, C. Herrmann, A. Nascetti, M. Overdick, and W. Ruetten, "Counting and Integrating Readout for Direct conversion X-ray Imaging: Concept, Realization and First Prototype Measurements," IEEE Trans. Nucl. Sci., vol. 54, pp. 383-390, 2007, which is incorporated herein by reference. If the output voltage V exceeds a threshold $V_{th}$, the logic circuit 14 generates a first control pulse having a duration $\Delta t_1$, which subtracts a fixed charge $q_{p1}$=$i_p\Delta t_1$. If after the first control pulse V does not fall below the threshold, the logic circuit 14 generates a second control pulse of duration $\Delta t_2$, which subtracts another fixed charge $q_{p2}$=$i_p\Delta t_2$. This sequence continues until V falls below the threshold. The number and duration of pulses defines the charge to be added to that measured from the resulting voltage V.

Figure 4:
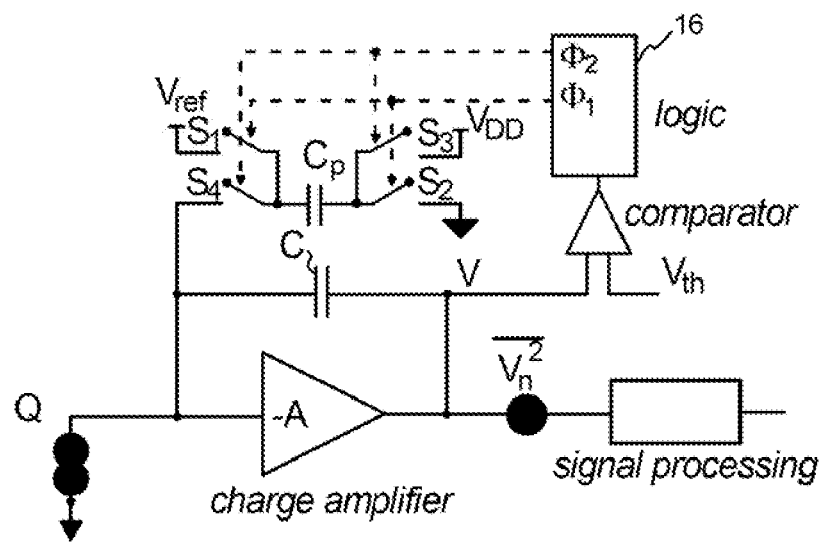
FIG. 4 is a block diagram of a charge amplifier in a capacitive charge-pump configuration.

The disadvantage of this method is the length of time required for the entire integration to be performed, which is derived from the requirement concerning the accuracy of $\Delta t$. If $q_p$=$i_p\Delta t$ is the subtracted charge and $\sigma_t$ is the time jitter on $\Delta t$, the noise associated with the charge subtraction is given by $\sigma_q$=$\sigma_t i_p$=$\sigma_t q_p/\Delta t$. The noise can then be reduced by increasing $\Delta t$, but the duration of the integration increases accordingly.
Capacitive Charge-Pump Method This method includes subtracting amounts of charge by charging and discharging a capacitor $C_p$, as shown in FIG. 4 and described in further detail in G. Mazza, R. Cirio, M. Donetti, A. La Rose, A. Luparia, F. Marchetto, and C. Peroni, "A 64-Channel Wide Dynamic Range Charge Measurement ASIC for Strip and Pixel Ionization Detectors," IEEE Trans. Nucl. Sci, vol. 52, pp. 847-853, 2005, which is incorporated herein by reference. The reference voltage $V_{ref}$ is assumed to be equal to the amplifier input voltage. If the output voltage V exceeds a threshold $V_{th}$, a logic circuit 16 generates a first cycle of control pulses that opens switches $S_1$ and $S_2$ and closes switches $S_3$ and $S_4$, which subtracts a fixed charge $q=V_{DD}/C_p$. If after the first cycle of control pulses, V does not fall below the threshold, the logic circuit 16 generates a second cycle of control pulses, which subtracts another fixed charge q. This sequence continues for an arbitrary number of control pulses until V falls below the threshold. The number of control cycles defines the charge to be added to that measured from the resulting voltage V.

The disadvantage of this method is that it requires a switch connected to the input node of the charge amplifier. As a consequence, parasitic charge is injected during the switching activity.

Figure 5:
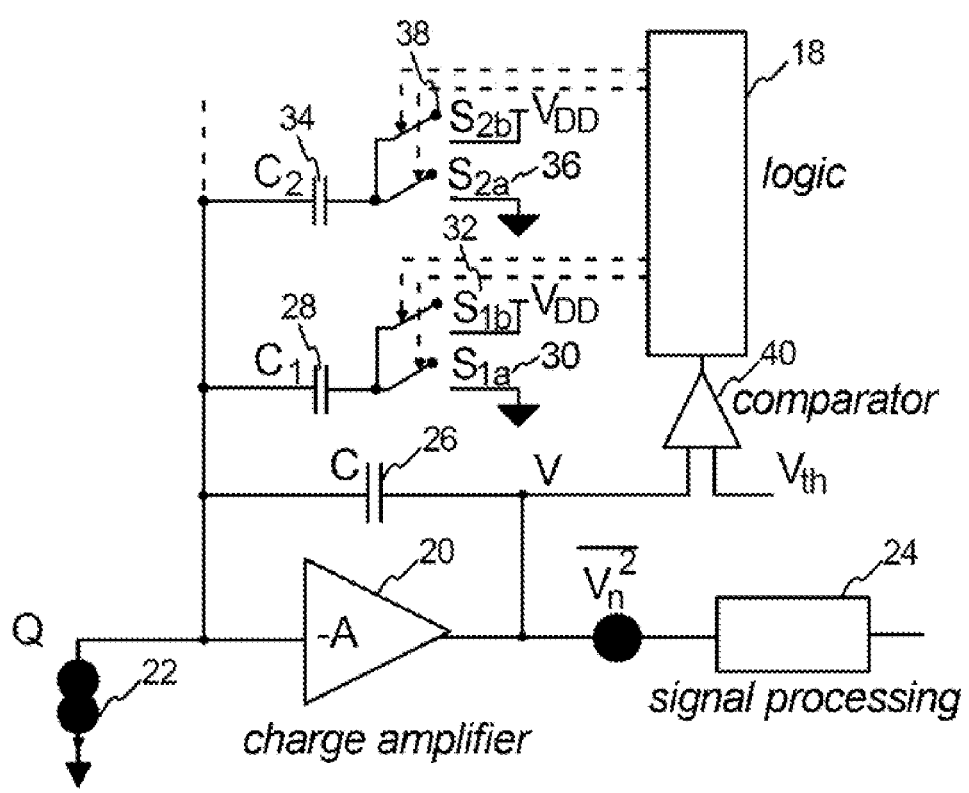
FIG. 5 is a block diagram of a charge amplifier configuration in accordance with a first embodiment of the present invention.

FIG. 5 shows a preferred embodiment of a charge amplifier formed in accordance with the present invention. The charge amplifier includes an operational amplifier 20, which is responsive to an applied charge source 22 and outputs a voltage to a signal processing circuit 24. A capacitor 26 is electronically coupled in parallel with the operational amplifier 20, that is, the capacitor 26 is connected across the anode and cathode of the operational amplifier 20. Another capacitor 28 is electronically coupled in series between the anode of the operational amplifier 20 and a bank of switches $S_{1b}$ 32 and $S_{1a}$ 30 with common input. Yet another capacitor 34 is shown connected (similarly to capacitor 28) electrically in series between the anode of operational amplifier 20 and a bank of switches $S_{2a}$ 36 and $S_{2b}$ 38. The logic circuit 18 preferably controls each of the switches $S_{1a}$ 30, $S_{1b}$ 32, $S_{2a}$ 36, and $S_{2b}$ 38. One input of a comparator 40 is preferably connected to the cathode of the operational amplifier 20, and a remaining input of comparator 40 is connected to a threshold voltage $V_{th}$. The output of comparator 40 is then provided to the logic circuit 18.

The method in accordance with the present invention subtracts amounts of charge by using a number of additional capacitors $C_j$ controlled through switches $S_{ja}$ and $S_{jb}$, as shown in FIG. 5. If the output voltage V exceeds a threshold voltage $V_{th}$, the logic circuit 18, by opening $S_{1a}$ and closing $S_{1b}$, routes the terminal of a first capacitor $C_1$ from a first fixed voltage $V_1$ (which is preferably ground, as shown in FIG. 5) to a higher fixed voltage $V_2$ (preferably the supply $V_{DD}$ shown in FIG. 5), thereby subtracting a charge $C_1(V_2-V_1)$ ($C_1 V_{DD}$ in the case of FIG. 5). If after the first subtraction V does not fall below the threshold, the logic circuit 18 preferably performs a second subtraction $C_2(V_2-V_1)$ through a second capacitor $C_2$. This sequence continues until V does fall below the threshold. The number of subtractions, along with the associated $C_j$, defines the charge to be added to that measured from the resulting voltage V. The values of the capacitors $C_j$ are chosen to cover the dynamic range of interest.

Figure 6:
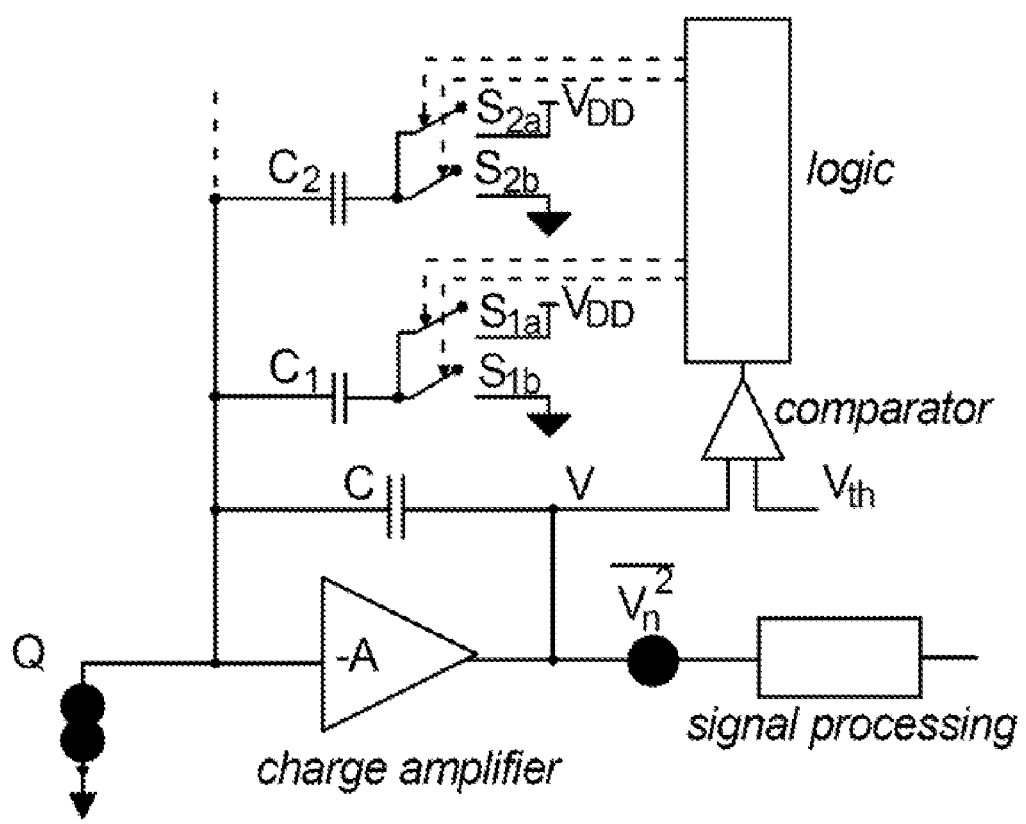
FIG. 6 is a block diagram of a charge amplifier configuration in accordance with a second embodiment of the present invention.

The configuration shown in FIG. 5 is intended for measuring positive charges. A configuration for measuring negative charges can also be realized by inverting VDD and ground at each of the switches $S_{Ja}$ and $S_{Jb}$ in FIG. 5). For example, switch $S_{1a}$ 30 is connected to the higher fixed voltage $V_2$, which is preferably $V_{DD}$, and switch $S_{1b}$ 32 is connected to the lower fixed voltage $V_1$, which is preferably ground, as shown in FIG. 6.

Figure 7:
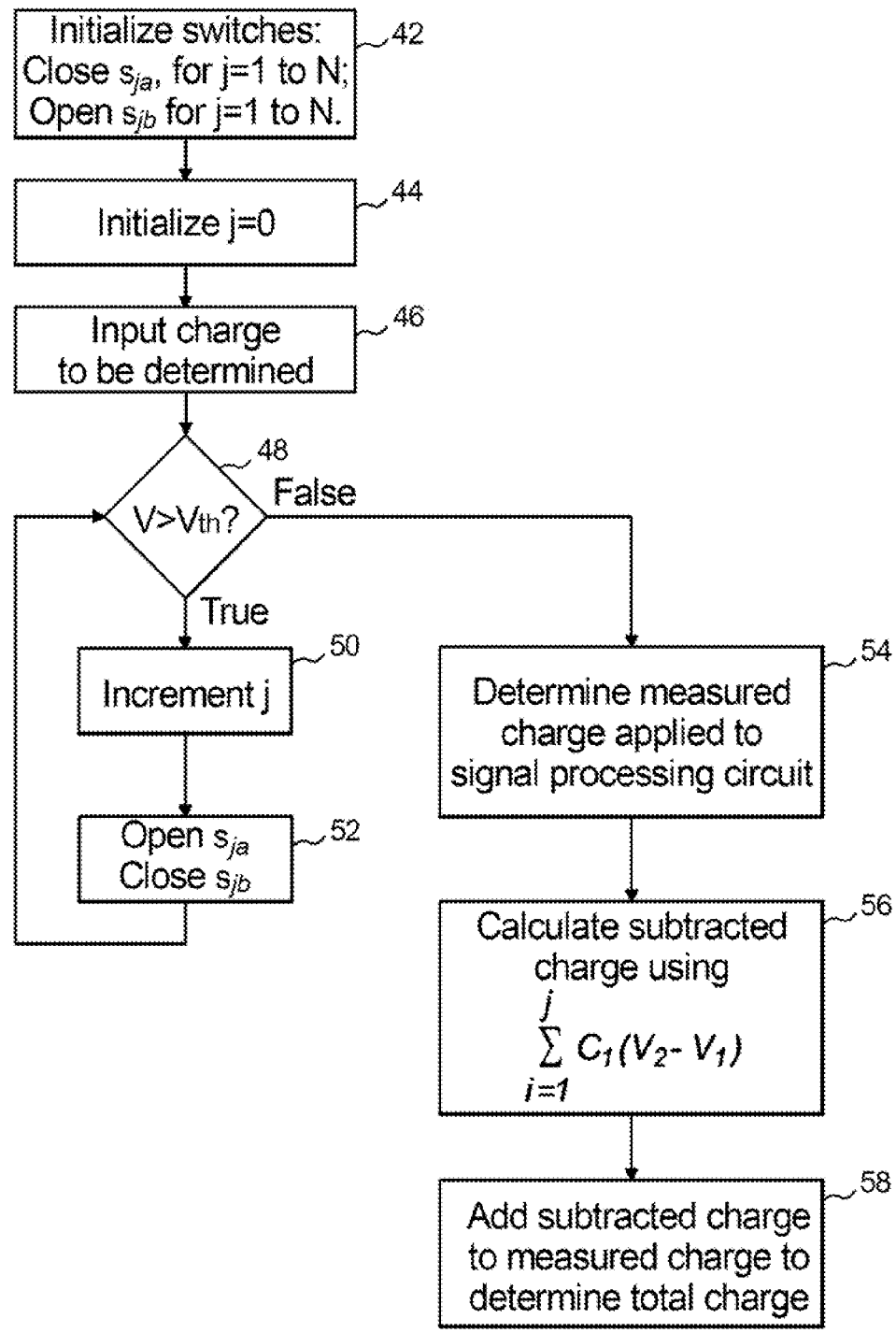
FIG. 7 is a flow chart of a method for determining charge using the charge amplifier configuration shown in FIG. 5.

FIG. 7 shows a flow chart of the method for use in accordance with a charge amplifier configuration shown in FIG. 5. Each of these switches, as designated by J=1 to N, where N is the total number of $S_a$ switches and total number of $S_b$ switches, is initiated by closing the $S_{Ja}$ switches for J=1 to N and opening the $S_{Jb}$ switches for J=1 to N in step 42. J, an index variable, is then initialized to 0 in step 44 and the charge to be determined is inputted in step 46. If V is greater than $V_{th}$ in step 48, then J is incremented by 1 instead of 50. V$S_a$ switch corresponding to the current value of J is then opened, and the V$S_b$ switch corresponding to the current value of J is closed in step 52 and the voltage V is then checked against the $V_{th}$ in step 48.

If the voltage V is not greater than $V_{th}$ in step 48, the measured charge is applied to the signal processing circuit in step 54. The subtracted charged is then calculated in step 56 using the following equation:

$$\sum_{i=1}^{j} C_i(V_2 - V_1)$$

The subtracted charge calculated in step 56 is then added to the measured charge determined in step 54 to determine the total charge in step 58.

As an example, if the total charge were Q=1.1 pC (picocoulombs), Cj=0.1pF, and V2−V1=2.5V, then four (4) subtractions would be required, each being of 0.25 coulombs, yielding a subtracted charge of 1.0 picocoulombs and a measured charge of 0.1 picocoulombs.

Thus, the method of the present invention advantageously increases the dynamic range of a charge amplifier without requiring accurate timing signals or switches connected to the input of the charge amplifier. The present invention also provides the advantage of a signal-to-noise ratio that is not limited to that achievable using the configuration shown in FIG. 1. In the case of FIG. 5 and assuming identical Cj, for a given charge Q, the resulting voltage is given by $V=Q/C-NV_{DD}$ where N is the number of subtractions. The maximum signal-to-noise ration or dynamic range is then effectively given by $$[V_{DD} + NV_{DD}]C \Big/ \left(C\sqrt{v_n^2}\right) = \frac{V_{DD}(N+1)}{\sqrt{v_n^2}}$$

which increases with N.

Although illustrative embodiments of the present invention have been described herein with reference to the accompanying drawing, it is to be understood that the invention is not limited to those precise embodiments, and that various other changes and modifications may be effected therein by one skilled in the art without departing from the scope or spirit of the invention.

The invention claimed is:

1. An electronic circuit adapted to be used in radiation sensing comprising:
   a charge amplifier, including a operational amplifier and a first capacitor electrically connected in parallel and having a common input node connected to an anode of the operational amplifier and a common output node connected to a cathode of the operational amplifier, receiving a total quantity of charge at the common input node from a radiation detector and generating a voltage output at the common output node;
   at least one switch including a switch output node and a switchable input node, wherein the switchable input node of the at least one switch is configured to be connected to a first voltage of at least two voltages;
   at least one second capacitor electrically connected in series between the common input node and the switch output node, the at least one second capacitor being electrically connected to the common input node without a switch connected therebetween;

a comparator including a first input node, a second input node; and a comparator output node, wherein the first input node is electrically connected to the common output node and the second input node is electrically connected to a threshold voltage, wherein the comparator makes a comparison of the voltage output generated at the common output node and the threshold voltage and delivers a result of the comparison to the comparator output node;

a logic circuit electrically connected to the comparator output node and to the at least one switch and controlling selective coupling of the switchable input node based upon the result delivered to the comparator output node, wherein if the result delivered to the comparator output node indicates that the voltage output does not equal or exceed the threshold voltage, then the logic circuit leaves the configuration of the at least one switch as it is, else wherein if the result delivered to the comparator output node indicates that the voltage output is equal to or exceeds the threshold voltage, then the logic circuit selects a second voltage of the at least two voltages for coupling to the switchable input node of a first of the at least one switches appropriate to activate a first of the at least one second capacitors and to effect a subtraction of some quantity of charge from the total quantity of charge received at the common input node from the rediation detector; and an analog signal processing circuit electrically connected to the common output node and providing analog filtering of the voltage output generated by the charge amplifier.

2. The electronic circuit defined by claim 1, wherein following the subtraction of the some quantity of charge from the total quantity of charge received at the common input node from the radiation detector, the comparator iterates the comparison process.

3. The electronic circuit defined by claim 2, wherein if the result of the iterated comparison process continues to indicate that the voltage output is equal to or exceeds the threshold voltage, then the logic circuit iteratively selects a subsequent voltage of the at least two voltages for coupling to the switchable input nodes of additional at least one switches appropriate to activate additional at least one second capacitors and effect additional subtractions of quantities of charge from the total quantity of charge received at the common input node from the radiation detector until the voltage output generated by the charge amplifier does not equal or exceed the threshold voltage.

4. The electronic circuit defined by claim 1, wherein the at least two voltages includes a first voltage and a second voltage, the first voltage being less than the second voltage, the logic circuit controlling the at least one switch to selectively couple the switchable input node to the second voltage in response to the result indicating that the voltage output of the charge amplifier is equal to or exceeds the threshold voltage.

5. The electronic circuit defined by claim 1, wherein the at least two voltages includes a first voltage and a second voltage, the first voltage being less than the second voltage, the logic circuit controlling the at least one switch to selectively couple the switchable input node to the first voltage in response to the result indicating that the voltage output of the charge amplifier does not equal or exceed the threshold voltage.

6. The electronic circuit defined by claim 1, wherein the electronic circuit-is implemented using at least one of an Application Specific Integrated Circuit (ASIC), a microprocessor, a micro controller, a programmable logic device, and a gate array.

7. The electronic circuit of claim 1, wherein a value of only one of the at least two voltages is ground and values of others of the at least two voltages are non-ground.

8. The electronic circuit of claim 1, wherein the total quantity of charge received from the radiation detector at the common input node is a quantity of positive charge.

9. The electronic circuit of claim 1, wherein the total quantity of charge received from the radiation, detector at the common input node is a quantity of negative charge.

10. The electronic circuit of claim 1, wherein the analog filtering provided by the analog signal processing circuit improves the signal to noise ratio for the voltage output generated by the charge amplifier.

11. A method of measuring charge and providing analog filtering of a voltage output signal generated by a charge amplifier in radiation sensing comprising:

receiving a total quantity of charge from a radiation detector by a charge amplifier, including a operational amplifier and a first capacitor electrically connected in parallel and having a common input node connected to an anode of the operational amplifier and a common output node connected to a cathode of the operational amplifier, at the common input node;

generating a voltage output signal at the common output node by the charge amplifier in response to receiving the total quantity of charge from the radiation detector;

making a comparison by a comparator, including a first input node, a second input node, and a comparator output node, wherein the first input node is electrically connected to the common output node and the second input node is electrically connected to a threshold voltage, of the voltage output signal generated at the common output node and the threshold voltage;

delivering a result of the comparison by the comparator to the comparator output node;

controlling via a logic circuit selective coupling of at least one switch, including a switch output node and a switchable input node configured to couple to a first voltage of at least two voltages, wherein the logic circuit is electrically connected to the comparator output node and to the switchable input node, wherein if the result delivered to the comparator output node indicates that the voltage output signal does not equal or exceed the threshold voltage, then the logic circuit leaves the configuration of the at least one switch as it is, and wherein if the result delivered to the comparator output node indicates that the voltage output signal is equal to or exceeds the threshold voltage, then the logic circuit selects a second voltage of the at least two voltages for coupling to the switchable input node of a first of the at least one switches appropriate to activate a first of at least one second capacitors, wherein the at least one second capacitor is electrically connected in series to the common input node, without a switch connected therebetween, and to the switch output node, and to effect a subtraction of some quantity of charge from the total quantity of charge received at the common input node;

calculating a total quantity of charge by summing a charge measured for the voltage output signal generated at the common output node and the some quantity of charge subtracted from the total quantity of charge received at the common input node; and providing analog filtering of the voltage output signal generated by the charge amplifier by an analog signal processing circuit electrically connected to the common output node.

12. The method of measuring charge and providing analog filtering of a voltage output signal generated by a charge amplifier in radiation sensing defined by claim 11, further comprising: iterating the comparison process by the comparator following the subtraction of the some quantity of charge from the total quantity of charge received at the common input node from the radiation detector.

13. The method of measuring charge and providing analog filtering of a voltage output signal generated by a charge amplifier in radiation sensing defined by claim 12, wherein if the result of the iterated comparison process continues to indicate that the voltage output signal is equal to or exceeds the threshold voltage, iteratively selecting by the logic circuit a subsequent voltage of the at least two voltages for coupling to the switchable input nodes of additional at least one switches appropriate to activate additional at least one second capacitors and effect additional subtractions of quantities of charge from the total quantity of charge received at the common input node from the radiation detector until the voltage output signal generated by the charge amp 14. The method of measuring charge and providing analog lifier does not equal or exceed the threshold voltage. filtering of a voltage output signal generated by a charge amplifier in radiation sensing defined by claim 11, wherein the at least two voltages includes a first voltage and a second voltage, the first voltage being less than the second voltage, the method further comprising controlling the at least one switch to selectively couple the switchable input node to the second voltage in response to the result indicating that the voltage output signal of the charge amplifier is equal to or exceeds the threshold voltage.

15. The method of measuring charge and providing analog filtering of a voltage output signal generated by a charge amplifier in radiation sensing defined by claim 11, wherein the at least two voltages includes a first voltage and a second voltage, the first voltage being less than the second voltage, the method further comprising controlling the at least one switch to selectively couple the switchable input node to the first voltage in response to the result indicating that the voltage output signal of the charge amplifier does not equal or exceed the threshold voltage.

16. The method of measuring charge and providing analog filtering of a voltage output signal generated by a charge amplifier in radiation sensing defined by claim 11, further comprising implementing the electronic circuitry using at least one of an Application Specific Integrated Circuit (ASIC), a microprocessor, a microcontroller, a programmable logic device, and a gate array.

17. A non-transitory computer-readable medium comprising instructions, wherein execution of the instructions by at least one computing device controls measurement of charge and providing analog filtering of a voltage output signal generated by a charge amplifier in radiation sensing by:

receiving a total quantity of charge from a radiation detector by a charge amplifier, including a operational amplifier and a first capacitor electrically connected in parallel and having a common input node connected to an anode of the operational amplifier and a common output node connected to a cathode of the operational amplifier, at the common input node;

generating a voltage output signal at the common output node by the charge amplifier in response to receiving the total quantity of charge from the radiation detector;

making a comparison by a comparator, including a first input node, a second input node, and a comparator output node, wherein the first input node is electrically connected to the common output node and the second input node is electrically connected to a threshold voltage, of the voltage output signal generated at the common output node and the threshold voltage;

delivering a result of the comparison by the comparator to the comparator output node;

controlling via a logic circuit selective coupling of at least one switch, including a switch output node and a switchable input node configured to couple to a first voltage of at least two voltages, wherein the logic circuit is electrically connected to the comparator output node and to the switchable input node, wherein if the result delivered to the comparator output node indicates that the voltage output signal does not equal or exceed the threshold voltage, then the logic circuit leaves the configuration of the at least one switch as it is, and wherein if the result delivered to the comparator output node indicates that the voltage output signal is equal to or exceeds the threshold voltage, then the logic circuit selects a second voltage of the at least two voltages for coupling to the switchable input node of a first of the at least one switches appropriate to activate a first of at least one second capacitors, wherein the at least one second capacitor is electrically connected in series to the common input node, without a switch connected therebetween, and to the switch output node, and to effect a subtraction of some quantity of charge from the total quantity of charge received at the common input node;

calculating a total quantity of charge by summing a charge measured for the voltage output signal generated at the common output node and the some quantity of charge subtracted from the total quantity of charge received at the common input node; and providing analog filtering of the voltage output signal generated by the charge amplifier by an analog signal processing circuit electrically connected to the common output node.

18. The non-transitory computer-readable medium defined by claim 17, comprising further instructions to iterate the comparison process by the comparator following the subtraction of the some quantity of charge from the total quantity of charge received at the common input node from the radiation detector.

19. The non-transitory computer-readable medium defined by claim 18, wherein if the result of the iterated comparison process continues to indicate that the voltage output signal is equal to or exceeds the threshold voltage, execution of the instructions by the at least one computing device causes iterative selection by the logic circuit of a subsequent voltage of the at least two voltages for coupling to the switchable input nodes of additional at least one switches appropriate to activate additional at least one second capacitors and effect additional subtractions of quantities of charge from the total quantity of charge received at the common input node from the radiation detector until the voltage output signal generated by the charge amplifier does not equal or exceed the threshold voltage.

20. The non-transitory computer-readable medium comprising instructions defined by claim 17, wherein the at least two voltages includes a first voltage and a second voltage, the first voltage being less than the second voltage, wherein execution of the instructions by the at least one computing device further selectively couples the switchable input node to the second voltage in response to the result indicating that the voltage output signal of the charge amplifier is equal to or exceeds the threshold voltage.

21. The non-transitory computer-readable medium comprising instructions defined by claim 17, wherein the at least two voltages includes a first voltage and a second voltage, the first voltage being less than the second voltage, wherein execution of the instructions by at least one computing device further selectively couples the switchable input node to the first voltage in response to the result indicating that the voltage output signal of the charge amplifier does not equal or exceed the threshold voltage.

\* \* \* \* \*

UNITED STATES PATENT AND TRADEMARK OFFICE
CERTIFICATE OF CORRECTION

| | | |
|---|---|---|
| PATENT NO. | : 8,260,565 B2 | Page 1 of 1 |
| APPLICATION NO. | : 12/196504 | |
| DATED | : September 4, 2012 | |
| INVENTOR(S) | : De Geronimo et al. | |

It is certified that error appears in the above-identified patent and that said Letters Patent is hereby corrected as shown below:

On the Title Page

Item 12    Should read

De Geronimo, et al.

Item 75    Should read

Gianluigi De Geronimo, Syosset, NY (US)

Angelo Dragone, La Honda, CA (US)

Grzegorz Deptuch, Forest Park, IL (US)

Signed and Sealed this

Second Day of February, 2016

Michelle K. Lee
*Director of the United States Patent and Trademark Office*